United States Patent
Lin et al.

(10) Patent No.: US 6,777,295 B1
(45) Date of Patent: Aug. 17, 2004

(54) METHOD OF FABRICATING TRENCH POWER MOSFET

(75) Inventors: Jau-Yan Lin, Hsinchu (TW); Keh-Yuh Yu, Hsinchu (TW)

(73) Assignee: Advanced Power Electronics Corp. (TW)

(*) Notice: Subject to any disclaimer, the term of this patent is extended or adjusted under 35 U.S.C. 154(b) by 0 days.

(21) Appl. No.: 10/638,346

(22) Filed: Aug. 12, 2003

(51) Int. Cl.[7] ............................................. H01L 21/336
(52) U.S. Cl. ........................ 438/270; 438/137; 438/138; 438/173; 438/212; 438/268; 438/589
(58) Field of Search ................................ 438/137, 138, 438/173, 212, 268, 270, 271, 589

(56) References Cited

U.S. PATENT DOCUMENTS 6,423,618 B1 * 7/2002 Lin et al. .................... 438/589

\* cited by examiner

Primary Examiner—Jack Chen
(74) Attorney, Agent, or Firm—Hoffman Wasson & Gitler PC

(57) ABSTRACT

A method of fabricating trench power MOSFET is described. A first etching step is performed on a substrate to form a plurality of trenches and the substrate has a first doped region and a second doped region and serves as a drain region. A gate oxide layer and a polysilicon layer are then sequentially formed on the second doped region to create a gate region. Subsequent performance of a second etching step utilizes a mask layer to overlap the polysilicon layer. A portion of the second doped region is exposed and the exposed portion defines a base region. The polysilicon layer is etched to expose the gate oxide layer and the base region is simultaneously etched to remove a portion of the second doped region to expose the first doped region for forming an aligned source region. A contact region in the source region is finally formed to fabricate the trench power MOSFET.

24 Claims, 5 Drawing Sheets

METHOD OF FABRICATING TRENCH POWER MOSFET

FIELD OF THE INVENTION

The present invention generally relates to a method of fabricating a semiconductor device, and more particularly, to a method of fabricating a trench power MOSFET.

BACKGROUND OF THE INVENTION

MOSFET has gradually replaced the bipolar joint transistor (BJT). The MOSFET is one of the most popular integrated circuits (ICs) due to the power-saving ability and the rapid switching frequency of the MOSFET. In particular, the basic operation theorem of the trench power MOSFET is same as that of other kinds of MOSFET and the trench power MOSFET has a higher turn-on current of up to several amperes (A). Additionally, the trench power MOSFET is able to be advantageously operated by a low controlling voltage and has a lower power-consumption.

FIGS. 1–5 show a conventional method of fabricating trench power MOSFET. In FIG. 1, a silicon substrate 50 is provided and is used as a drain region of the MOSFET. A plurality of trenches 52 is then formed in the silicon substrate 50. In FIG. 2, a gate oxide layer 54 is formed in the sidewall of the trenches 52 and a polysilicon layer 56 is also filled within the trenches 52. The polysilicon layer 56 is stripped away and the silicon substrate 50 is exposed, and the polysilicon layer 56 which remains in the trenches 52 is used as a gate region.

In FIG. 3, a photoresist layer 58 is deposited on the silicon substrate 50 and a portion of silicon substrate 50 between two trenches 52 is covered for patterning. The portion called a base region 68 is defined as source region 66. Afterwards, a heating tube process is implemented to form a source region 66. The photoresist layer 58 on the silicon substrate 50 is stripped away in FIG. 4. Finally, in FIG. 5, a dielectric layer 60 and metal interconnect 62 are deposited to form a conventional trench power MOSFET.

During the above process of the MOSFET, a photoresist layer 58 is required to cover the base region 68 for forming a source region 66. However, with the shrinkage of the devices, a photomask problem often occurs during a step of photomask alignment. Therefore, the degree of difficulty of the base region formation is severely increased, resulting in a low yield rate for the process. Moreover, the electrical characteristic of the base region 68 is neutralized when a drive-in step of the base region 68 is performed. As a result, the electrical characteristic between the metal interconnect 62 and the source region 66 degrades to reduce the performance of the trench power MOSFET.

SUMMARY OF THE INVENTION

One object of the present invention is a method of fabricating trench power MOSFET in which a gate mask layer is used to overlap the gate region. An aligned source region is formed by the mask layer between the two gate regions to save an additional photomask of forming the source region.

Another object of the present invention is a method of fabricating trench power MOSFET in which a mask layer capping the gate region is utilized to form the aligned source region and to solve the alignment problem of the photomask in the source region.

According to the above objects, the present invention sets forth a method of fabricating trench power MOSFET. An epitaxial silicon layer is formed on a substrate and the epitaxial silicon layer serves as a drain region. A device region is then formed in the epitaxial silicon layer. A first implanting step is performed on the device region to form a first doped region. A second implanting step is then performed on the first doped region of the device region to form a second doped region in the first doped region. Afterwards, a first patterned etching is employed to form a plurality of trenches in the device region wherein a depth of the trenches is greater than that of the first doped region. A gate oxide layer and a polysilicon layer are sequentially formed on the second doped region to fill the trenches and to define a gate region.

A second patterned etching is performed to form a gate mask layer and to cover the gate oxide layer and the polysilicon layer of the trenches, in which a portion of the second doped region between the trenches is exposed and defines a base region, and a width of the gate mask layer is greater than that of the base region. The mask region layer is stripped away to expose the polysilicon layer in the trenches. A portion of the polysilicon layer is etched by a blanket etching step to expose the gate oxide layer and simultaneously the base region is etched to expose the first doped region to create an aligned source region. The source region is positioned between the base region and the gate region.

Significantly, the polysilicon layer of the gate region is etched and the gate oxide layer is used as an etching stop layer. The polysilicon layer remains in the trenches as the gate region. More importantly, if the polysilicon layer of the gate region is etched, the second doped region of the base region is simultaneously etched until the first doped region is exposed. In other words, the second doped region between two trenches is divided into two portions by the base region and each portion is a source region. A contact region is finally constructed in the source region and a metallization step is performed to connect the contact region by a conductive layer, thus forming a trench power MOSFET.

The width of the source region and the base region have been reduced by the smaller size of the device since the width of the gate mask layer is advantageously greater than that of the base region in the present invention. A gate mask layer is formed by covering the trenches with gate oxide and the polysilicon layer by using a mask layer to save an additional mask for fabricating the source region. Specifically, better electrical contact is established between the source region and the conductive layer. There is advantageously an electrical increment between the source region and the conductive layer in the present invention due to an electrical contact between the upper surface of the source region and the conductive layer and a contact interface between the source region and the base region.

In summary, the present invention utilizes a method of fabricating trench power MOSFET. A mask layer overlaps with the gate region. An aligned source region is formed by the mask layer between the two gate regions to save an additional photomask for forming the source region. Further, the mask layer capping the gate region is utilized to form the aligned source region and to solve the alignment problem of the photomask in the source region.

BRIEF DESCRIPTION OF THE DRAWINGS

The foregoing aspects and many of the attendant advantages of this invention will become more readily appreciated as the same becomes better understood by reference to the following detailed description when taken in conjunction with the accompanying drawings, wherein.

DETAILED DESCRIPTION OF THE PREFERRED EMBODIMENTS

The present invention is directed to a method of fabricating trench power MOSFET. A mask layer, such as a photoresist layer, overlaps the gate region. An aligned source region is formed by the mask layer between the two gate regions to save an additional photomask for forming the source region. Further, the mask layer of capping the gate region is utilized to form the aligned source region and to solve the alignment problem of the photomask in the source region.

Figure 1:
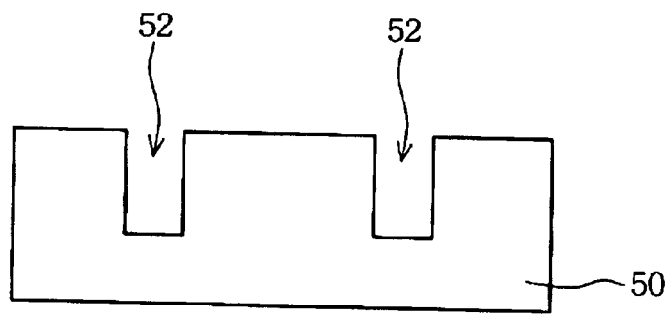
FIGS. 1–5 illustrate a conventional method of fabricating trench power MOSFET.
Figure 2:
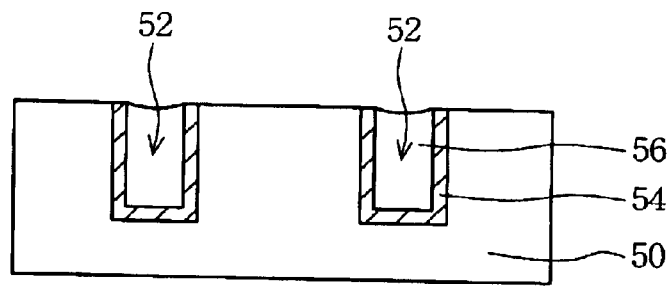
Figure 3:
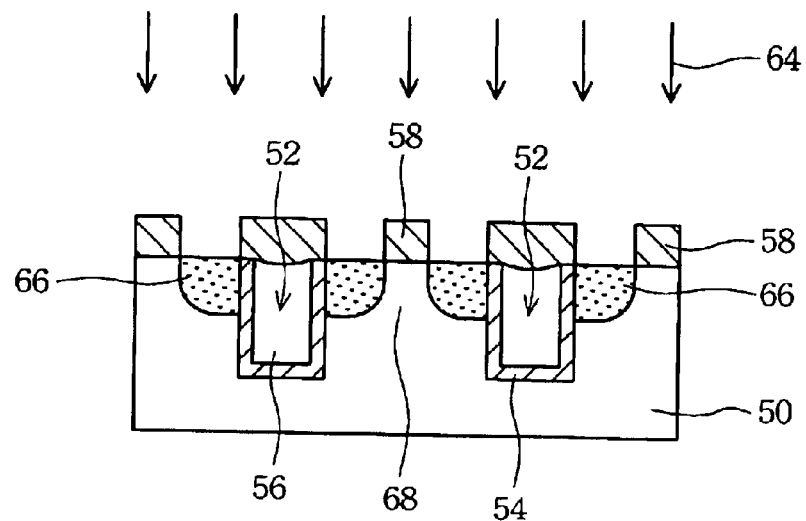
Figure 4:
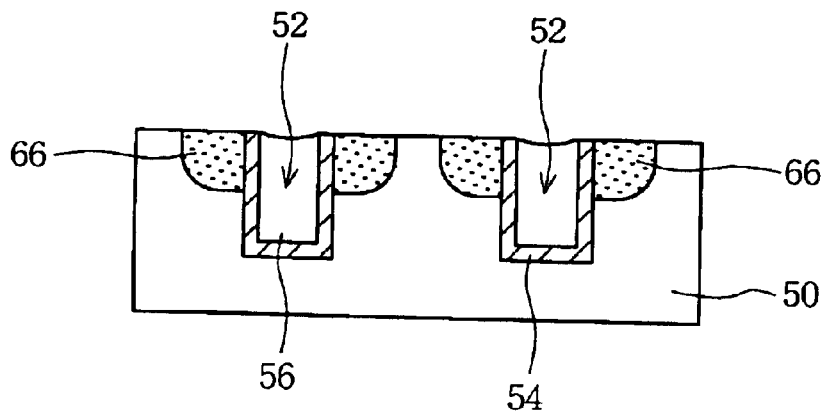
Figure 5:
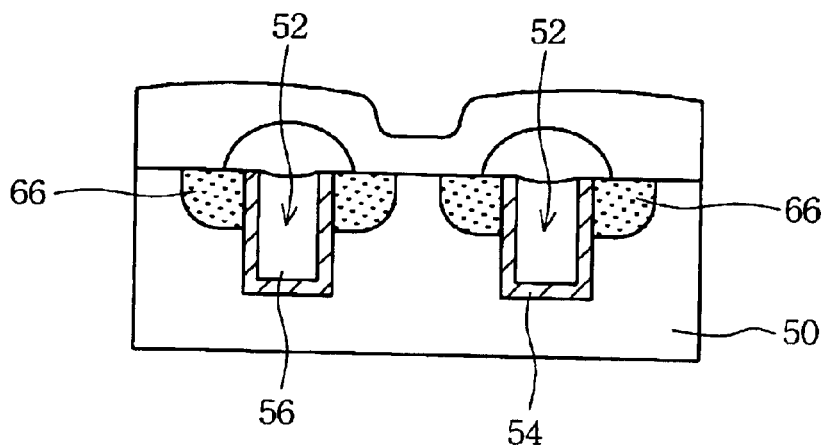
Figure 6:
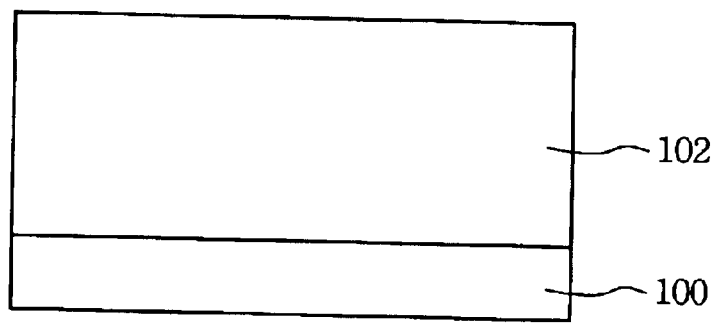
FIGS. 6–12 illustrate a method of fabricating trench power MOSFET in accordance with the present invention.

FIGS. 6–12 show a method of fabricating trench power MOSFET in accordance with the present invention. In FIG. 6, an epitaxial silicon layer 102 is formed on the substrate 100. The epitaxial silicon layer 102 serves as a drain region and has a device region 104 thereon. A field oxide layer (not shown) is then formed on the epitaxial silicon layer 102 and a portion of the field oxide layer is removed to form the device region 104.

Figure 7:
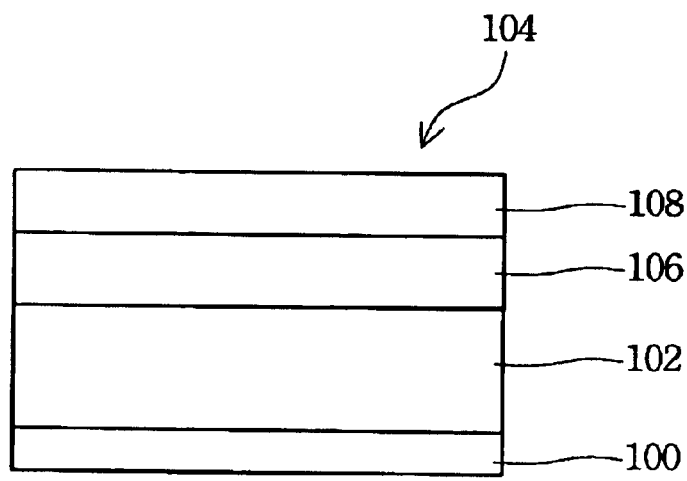

In FIG. 7, a first implanting step is performed on the device region 104 to form a first doped region 106 and a second implanting step is employed on the first doped region 106 of the device region 104 to form a second doped region 108 in a portion of the first doped region 106. The implanting step is preferably performed by heating tube or ion implantation. The first doped region 106 and the second doped region 108 have opposite electrical characteristic, such as N-type or P-type. For example, the dopant of the first doped region 106 is boron and the dopant of the second doped region 108 is phosphide.

Figure 8:
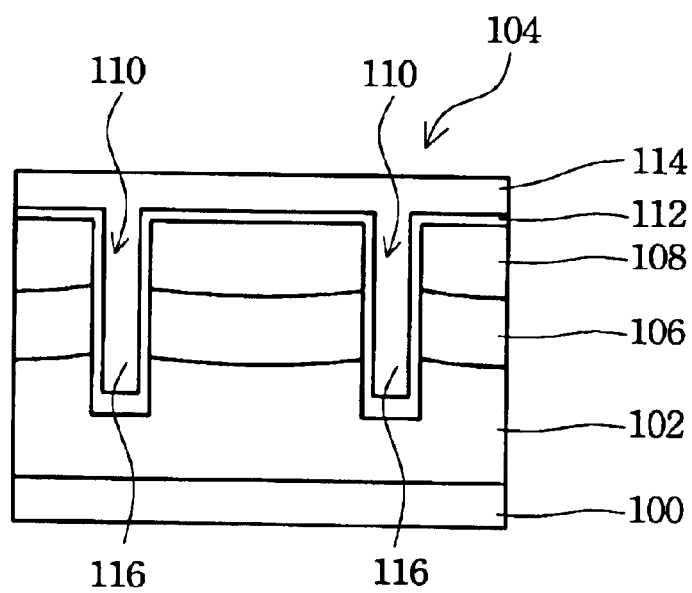

A first patterned etching is performed to form a plurality of trenches 110 in the device region 104 in FIG. 8. The depth of the trenches 110 is greater than that of the first doped region 106. A gate oxide layer 112 and a polysilicon layer 114 are sequentially formed on the second doped region 108 to fill the trenches 110 defining a gate region 116. A thermal oxidation preferably fabricates the gate oxide layer 112 having a thickness ranging between about 100 and 800 angstroms. A chemical vapor deposition (CVD) preferably forms the polysilicon layer 114 having a thickness ranging between about 5000 and 8000 angstroms.

Figure 9:
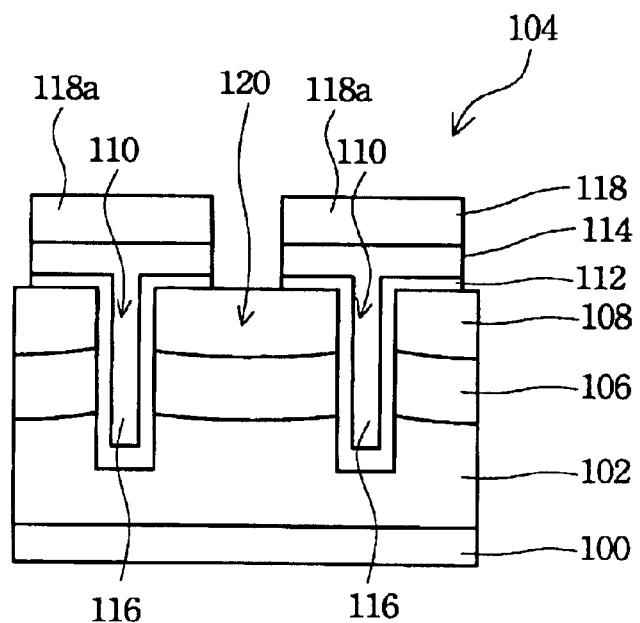
Figure 10:
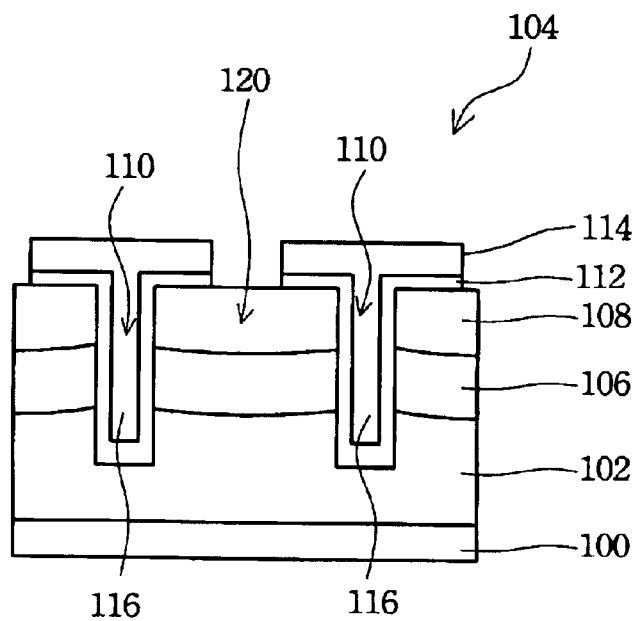

In FIG. 9, a mask layer 118 is formed by a second patterned etching and covers gate oxide layer 112 and the polysilicon layer 114 of the trenches 110. The portion of the second doped region 108 between the trenches 110 is exposed and defines a base region 120. The width of the gate mask layer 118a is greater than that of the base region 120. Specifically, a photoresist layer 118 is deposited on the polysilicon layer 114 and using a mask implements an exposure and development step on the photoresist 118 so that the gate region 116 is overlapped by the gate mask layer 118. The gate mask layer 118 between two gate regions 116 defines a source region. In FIG. 10, the gate mask layer 118a is stripped to expose the polysilicon layer 114 in the trenches 110 and the second doped region 108 between the polysilicon layers 114.

Figure 11:
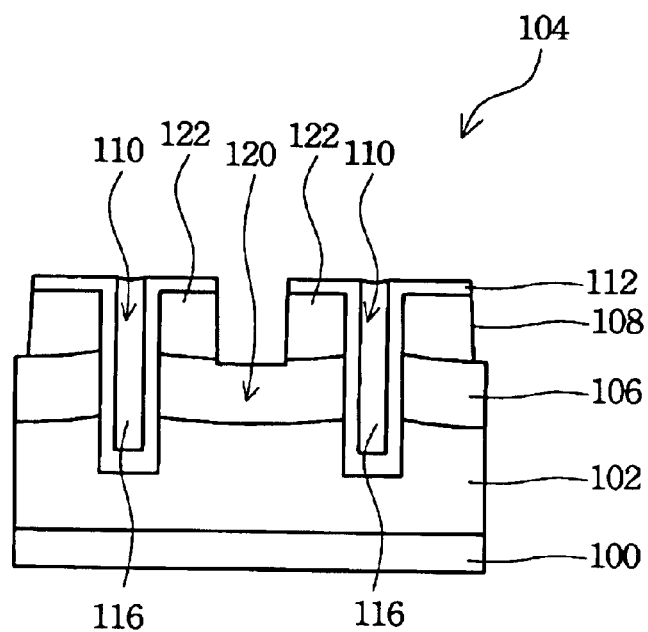

A portion of the polysilicon layer 114 is performed by a blanket etching to expose the gate oxide layer 112 in FIG. 11. The etching reagent preferably includes He, $Cl_2$, HBr, $C_2F6$, $SF_6$ and $O_2$. The base region 120 is simultaneously etched to expose the first doped region 106 and to form an aligned source region 122. The source region 122 is positioned between the base region 120 and the gate region 116.

Significantly, the polysilicon layer 114 of the gate region 116 is etched and the gate oxide layer 112 serves as an etching stop layer. The polysilicon layer 114 remains in the trenches 110 to serve as the gate region 116. More importantly, if the polysilicon layer 114 of the gate region 116 is etched, the second doped region 108 of the base region 120 is simultaneously etched until the first doped region 106 is exposed. In other words, the second doped region 108 between two trenches 110 is divided into two portions by the base region 120 and each portion is a source region 122.

The depth of the base region 120 ranges from about 2500 to 4500 angstroms. In addition, a doping step in the base region 120 is performed to increase a dopant concentration of the base region 120 and to improve the electrical contact of the source region 122 after the step of etching a portion of the polysilicon layer 114 and simultaneously etching the base region 120.

Figure 12:
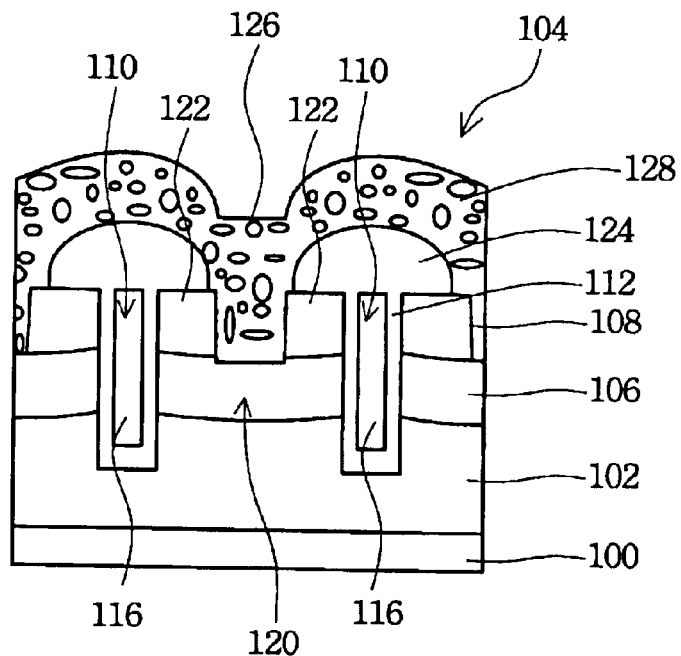

In FIG. 12, a dielectric layer 124 is formed between the gate region 116 and the source 122 to cover the device region 104. A contact region 126 is then formed in the source region 122 and a metallization step is performed to create a conductive layer 128 to connect the contact layer 126 and construct a trench power MOSFET.

The width of the source region 122 and the base region 120 is reduced by the smaller size of the device since the width of the gate mask layer 118a is greater than that of the base region 120. However, in the present invention, a gate mask layer 118a is formed by covering the trenches 110 with the gate oxide layer 112 and the polysilicon layer 114 with the use of a mask layer 118 to save an additional mask for fabricating the source region 122. That is, during the formation process of the trench power MOSFET, the width of the base region 120 is not easily adjusted due to difficulty in controlling the or the precision limit of the process equipment. In the present invention, a gate mask layer 118 overlaps the polysilicon layer 114 on the gate region 116. The epitaxial silicon layer 102 is shallowly etched to form the source region 122. As a result, one mask in the source region and the mask alignment problem are eliminated.

Specifically, since the upper surface of the source region 122 electrically contacts the conductive layer 128 and there is a contact interface between the source region 122 and the base region 120 in the present invention, there is a better electrical characteristic between the source region 122 and the conductive layer 128. The contact interface of the source region 122 is superior to that of the conventional structure where an upper surface of the source region merely contacts the conductive layer. In other words, the second doped region 108 is penetrated to form a greater contact interface between the source region 122 and the conductive layer 128. Consequently, the MOSFET has a high breakdown voltage during turn-off to increase the performance of the MOSFET.

According to the above, the present invention utilizes a method of fabricating trench power MOSFET. A mask layer covers the portion near the gate region and an aligned sourced region between two gate regions is simultaneously formed by the mask layer. As a result, a mask is eliminated in the process of forming the source region. The mask layer capping the gate region is also utilized to form the aligned source region and to solve the alignment problem of the photomask in the source region. Further, the second doped region forms a greater contact interface between the source region and the conductive layer so that the MOSFET has a high breakdown voltage during turn-off to increase the performance of the MOSFET.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modification and similar structure.

What is claimed is:

1. A method of fabricating trench power MOSFET, comprising the steps of:
    providing a silicon substrate;
    forming an epitaxial silicon layer on the substrate, wherein the epitaxial silicon layer serves as a drain region;
    forming a field oxide layer on the epitaxial silicon layer;
    removing a portion of the field oxide layer to form a device region;
    performing a first implanting step on the device region to form a first doped region;
    performing a second implanting step on the first doped region of the device region to form a second doped region in a portion of the first doped region;
    performing a first patterned etching to form a plurality of trenches in the device region, wherein a depth of the trenches is greater than that of the first doped region;
    sequentially forming a gate oxide layer and a polysilicon layer on the second doped region to fill the trenches defining a gate region;
    performing a second patterned etching to form a gate mask layer and to cover the polysilicon layer of the trenches, wherein a portion of the second doped region between the trenches is exposed and defines a base region, and a width of the gate mask layer is greater than that of the base region;
    stripping the gate mask layer to expose the polysilicon layer in the trenches;
    etching a portion of the polysilicon layer to expose the gate oxide layer and simultaneously etching the base region to expose the first doped region to form an aligned source region, wherein the source region is positioned between the base region and the gate region; and
    forming a contact region in the source region and performing a metallization step to connect source region and the base region.

2. The method of claim 1, wherein the step of forming the gate oxide layer comprises thermal oxidation.

3. The method of claim 1, wherein the gate oxide layer has a thickness ranging between about 100 and 800 angstroms.

4. The method of claim 1, wherein the step of forming the epitaxial silicon layer comprise a chemical vapor deposition.

5. The method of claim 1, wherein the polysilicon layer has a thickness ranging between about 5000 and 8000 angstroms.

6. The method of claim 1, wherein a material of the gate mask layer comprises photoresist.

7. The method of claim 1, wherein after the steps of etching a portion of the polysilicon layer to expose the gate oxide layer and simultaneously etching the base region, an implantation step is further performed in the base region to increase a dopant concentration of the base region and electrical contact of the source region.

8. The method of claim 1, wherein the depth of the base region ranges from about 2500 to 4500 angstroms.

9. A method of fabricating trench power MOSFET, wherein the trench power MOSFET is located in a substrate and the substrate has an epitaxial silicon layer to serve as a drain region, comprising the steps of:
    performing a first implanting step on a device region to form a first doped region;
    performing a second implanting step on the first doped region of the device region to form a second doped region in a portion of the first doped region;
    performing a first patterned etching to form a plurality of trenches in the device region wherein a depth of the trenches is greater than that of the first doped region;
    sequentially forming a gate oxide layer and a polysilicon layer on the second doped region to fill the trenches defining a gate region;
    performing a second patterned etching to form a gate mask layer and to cover the polysilicon layer of the trenches, wherein a portion of the second doped region between the trenches is exposed and defines a base region, and a width of the gate mask layer is greater than that of the base region;
    stripping the gate mask layer to expose the polysilicon layer in the trenches;
    etching a portion of the polysilicon layer to expose the gate oxide layer and simultaneously etching the base region to expose the first doped region to form an aligned source region, wherein the source region is positioned between the base region and the gate region; and
    forming a contact region in the source region and performing a metallization step to connect source region and the base region.

10. The method of claim 9, wherein the step of forming the gate oxide layer comprises thermal oxidation.

11. The method of claim 9, wherein the gate oxide layer has a thickness ranging between about 100 and 800 angstroms.

12. The method of claim 9, wherein the step of forming the polysilicon layer comprises chemical vapor deposition.

13. The method of claim 9, wherein the polysilicon layer has a thickness ranging between about 5000 and 8000 angstroms.

14. The method of claim 9, wherein a material of the gate mask layer comprises photoresist.

15. The method of claim 9, wherein after the steps of etching a portion of the polysilicon layer to expose the gate oxide layer and simultaneously etching the base region, an implanting step is further performed in the base region to increase a dopant concentration of the base region and electrical contact of the source region.

16. The method of claim 9, wherein the depth of the base region ranges between about 2500 and 4500 angstroms.

17. A method of fabricating trench power MOSFET, wherein the trench power MOSFET is located in a substrate, the substrate has an epitaxial silicon layer to serve as a drain region, and the epitaxial silicon layer has a first doped region and a second doped region with opposing electric characteristics, comprising the steps of:
    performing a first patterned etching to form a plurality of trenches in a device region, wherein a depth of the trenches is greater than that of the first doped region;
    sequentially forming a gate oxide layer and a polysilicon layer on the second doped region to fill the trenches defining a gate region;

performing a second patterned etching to form a gate mask layer and to cover the polysilicon layer of the trenches, wherein a portion of the second doped region between the trenches is exposed and defines a base region, and a width of the gate mask layer is greater than that of the base region;

stripping the gate mask layer to expose the polysilicon layer in the trenches;

etching a portion of the polysilicon layer to expose the gate oxide layer and simultaneously etching the base region to expose the first doped region to form an aligned source region, wherein the source region is positioned between the base region and the gate region; and forming a contact region in the source region and performing a metallization step to connect source region and the base region.

18. The method of claim 17, wherein the step of forming the gate oxide layer comprises a thermal oxidation.

19. The method of claim 17, wherein the gate oxide layer has a thickness ranging between about 100 and 800 angstroms.

20. The method of claim 17, wherein the step of forming the polysilicon layer comprises chemical vapor deposition.

21. The method of claim 17, wherein the polysilicon layer has a thickness ranging between about 5000 and 8000 angstroms.

22. The method of claim 17, wherein a material of the gate mask layer comprises photoresist.

23. The method of claim 17, wherein after the steps of etching a portion of the polysilicon layer to expose the gate oxide layer and simultaneously etching the base region, an implanting step is further performed in the base region to increase a dopant concentration of the base region and electrical contact of the source region.

24. The method of claim 17, wherein the depth of the base region ranges between about 2500 and 4500 angstroms.

* * * * *